United States Patent
Aoki

(10) Patent No.: US 9,954,023 B2
(45) Date of Patent: Apr. 24, 2018

(54) SOLID-STATE IMAGING DEVICE AND IMAGING APPARATUS

(71) Applicant: OLYMPUS CORPORATION, Tokyo (JP)

(72) Inventor: Jun Aoki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/000,788

(22) Filed: Jan. 19, 2016

(65) Prior Publication Data

US 2016/0133664 A1 May 12, 2016

Related U.S. Application Data

(63) Continuation of application No. PCT/JP2014/070182, filed on Jul. 31, 2014.

(30) Foreign Application Priority Data

Aug. 8, 2013 (JP) ................................ 2013-165511

(51) Int. Cl.
H01L 27/146 (2006.01)
H04N 5/374 (2011.01)
(Continued)

(52) U.S. Cl.
CPC .... *H01L 27/14634* (2013.01); *H01L 27/1469* (2013.01); *H01L 27/14605* (2013.01);
(Continued)

(58) Field of Classification Search
None
See application file for complete search history.

(56) References Cited

U.S. PATENT DOCUMENTS

2009/0295979 A1   12/2009   Matsuo et al.
2010/0238331 A1    9/2010   Umebayashi et al.
(Continued)

FOREIGN PATENT DOCUMENTS

JP   2009-290000 A   12/2009
JP   2010-245506 A   10/2010
(Continued)

OTHER PUBLICATIONS

International Search Report dated Nov. 11, 2014, issued in counterpart International Application No. PCT/JP2014/070182 (3 pages).
Office Action dated Apr. 25, 2017, issued in counterpart Japanese Application No. 2013-165511, with English translation (10 pages).

*Primary Examiner* — James Hannett
(74) *Attorney, Agent, or Firm* — Westerman, Hattori, Daniels & Adrian, LLP

(57) ABSTRACT

A solid-state imaging device includes a first substrate and a second substrate electrically connected to the first substrate. The first substrate includes a first semiconductor layer and one or more first wiring layers. The second substrate includes a second semiconductor layer and one or more second wiring layers. The first photoelectric conversion element overlaps any of the one or more first wiring layers at all positions on the first photoelectric conversion element in a planar view of the first substrate. The second photoelectric conversion element does not overlap any of the one or more first wiring layers at some positions on the second photoelectric conversion element in the planar view of the first substrate.

6 Claims, 8 Drawing Sheets

(51) Int. Cl.
*H04N 5/361* (2011.01)
*H04N 5/378* (2011.01)

(52) U.S. Cl.
CPC .. *H01L 27/14623* (2013.01); *H01L 27/14636* (2013.01); *H01L 27/14643* (2013.01); *H04N 5/361* (2013.01); *H04N 5/374* (2013.01); *H04N 5/378* (2013.01)

(56) References Cited

U.S. PATENT DOCUMENTS

| | | |
|---|---|---|
| 2012/0043636 A1 | 2/2012 | Nagata |
| 2012/0086094 A1 | 4/2012 | Watanabe |
| 2013/0083214 A1 | 4/2013 | Nakata |
| 2014/0145287 A1 | 5/2014 | Kato |
| 2016/0020240 A1* | 1/2016 | Hayashi .............. H01L 27/1461 257/432 |

FOREIGN PATENT DOCUMENTS

| | | |
|---|---|---|
| JP | 2010-267680 A | 11/2010 |
| JP | 2012-79861 A | 4/2012 |
| JP | 2012-84693 A | 4/2012 |
| JP | 2012-164870 A | 8/2012 |
| JP | 2012-204402 A | 10/2012 |
| JP | 2013-55159 A | 3/2013 |
| JP | 2013-77678 A | 4/2013 |

* cited by examiner

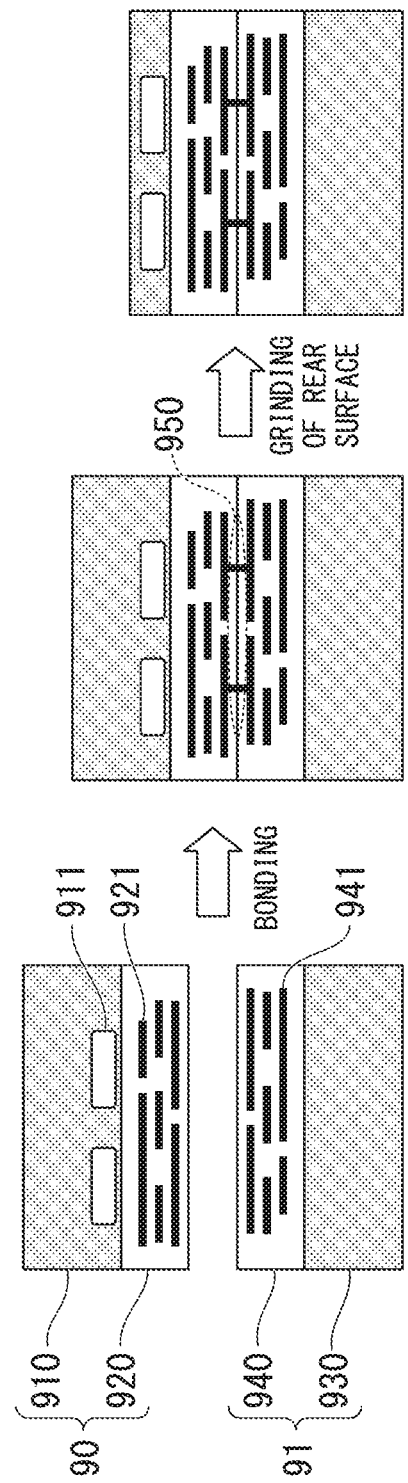

US 9,954,023 B2

SOLID-STATE IMAGING DEVICE AND IMAGING APPARATUS

This application is a continuation application of PCT Patent Application No. PCT/JP2014/070182, filed Jul. 31, 2014, whose priority is claimed on Japanese Patent Application No. 2013-165511, filed Aug. 8, 2013. The contents of the Japanese patent application and the PCT patent application are incorporated herein by reference.

BACKGROUND OF THE INVENTION

Field of the Invention

The present invention relates to a solid-state imaging device and an imaging apparatus which include a plurality of pixels and in which a first substrate and a second substrate having circuit elements of the pixels arranged thereon are electrically connected to each other by a connecting portion.

Description of Related Art

In recent years, video cameras, electronic still cameras, and the like have become generally widespread. Such cameras employ a charge-coupled device (CCD) type solid-state imaging device or an amplification type solid-state imaging device. The amplification type solid-state imaging device introduces signal charges, which are generated and stored by photoelectric conversion elements of pixels on which light is incident, into amplification elements of the pixels and outputs signals, which are amplified by the amplification elements, from the pixels. In the amplification type solid-state imaging device, such pixels are arranged in a two-dimensional matrix shape. Examples of the amplification type solid-state imaging device include a complementary metal oxide semiconductor (CMOS) type solid-state imaging device using CMOS transistors.

In the related art, a general CMOS type solid-state imaging device employs a method of sequentially reading out signal charges, which are generated by photoelectric conversion elements of pixels arranged in a two-dimensional matrix shape, for each row. In this method, since exposure timings in the photoelectric conversion elements of the pixels are determined depending on a start and an end of reading-out of the signal charges, the exposure timings differ depending on the rows. Accordingly, when a fast-moving subject is imaged using the CMOS type solid-state imaging device, a distortion of the subject occurs in the captured image.

In order to remove the distortion of a subject, a simultaneous imaging function (a global shutter function) of realizing simultaneous storage of signal charges has been proposed. The number of applications of the CMOS type solid-state imaging device having a global shutter function is increasing. The CMOS type solid-state imaging device having a global shutter function generally needs to include shaded memory elements in order to store signal charges generated by the photoelectric conversion elements until the signal charges are read out. In such a CMOS type solid-state imaging device, after all pixels are simultaneously exposed, signal charges generated by the photoelectric conversion elements are simultaneously transferred to the memory elements in all the pixels and are temporarily stored therein, and the signal charges are sequentially converted into pixel signals and read out at a predetermined readout timing.

However, in the CMOS type solid-state imaging device having the global shutter function in the related art, the photoelectric conversion elements and the memory elements have to be formed on the same plane of the same substrate, and thus an increase in chip area is inevitable. In a waiting period until the signal charges stored in the memory elements are read out, signal quality degrades due to noise based on light or noise based on a leakage current (dark current) generated in the memory elements.

In order to solve this problem, a method is disclosed of preventing an increase in chip area and reducing noise using a solid-state imaging device in which a first substrate having photoelectric conversion elements formed thereon and a second substrate having memory elements storing signal charges (electrical signals) generated by the photoelectric conversion elements formed thereon are bonded to each other (for example, see Japanese Unexamined Patent Application, First Publication No. 2012-79861).

FIG. 8 illustrates an example of a process of manufacturing a solid-state imaging device in which two substrates are bonded to each other. In FIG. 8, cross-sections of the two substrates are schematically illustrated. Steps illustrated in FIG. 8 will be described below.

First, a first substrate 90 and a second substrate 91 are prepared and bonded to each other. The first substrate 90 includes a first semiconductor layer 910 having photoelectric conversion elements 911 formed therein and a first interlayer film 920 having a first wiring layer 921 formed therein. The second substrate 91 includes a second semiconductor layer 930 having memory elements (not illustrated), which store electrical signals generated by the photoelectric conversion elements 911, formed therein and a second interlayer film 940 having a second wiring layer 941 formed therein. The first substrate 90 and the second substrate 91 are bonded to each other in a state in which the first interlayer film 920 and the second interlayer film 940 face each other. In the state in which the first substrate 90 and the second substrate 91 are bonded to each other, the first wiring layer 921 and the second wiring layer 941 are connected to each other by a connecting portion 950.

In the first semiconductor layer 910 of the first substrate 90, the photoelectric conversion elements 911 are formed on a front surface side (a side on which the first interlayer film 920 is formed) of the first semiconductor layer 910. The opposite surface (a surface exposed to the outside) of the surface in contact with the first interlayer film 920 is the rear surface of the first semiconductor layer 910.

After the bonding is performed, the rear surface of the first semiconductor layer 910 is ground such that light is incident on the photoelectric conversion elements 911. Since the first interlayer film 920 is very thin, generally, the grinding of the rear surface of the first semiconductor layer 910 is performed after two substrates are bonded to each other. After the grinding, a large amount of light incident from the rear surface of the first semiconductor layer 910 is absorbed by the first semiconductor layer 910 and thus disappears. However, since the first semiconductor layer 910 is thin, some light is transmitted by the first semiconductor layer 910 and is incident on the first interlayer film 920. When the light transmitted by the first semiconductor layer 910 is incident on the memory elements formed in the second semiconductor layer 930 of the second substrate 91, noise is mixed into signals. In order to prevent this mixture of noise, the first wiring layer 921 and the second wiring layer 941 are arranged to block the light transmitted by the first semiconductor layer 910.

Before the first substrate 90 and the second substrate 91 are bonded to each other, an operation check and a characteristic check are performed on the individual substrates. The operation check is to check whether the solid-state imaging device operates in accordance with a control signal when the control signal is supplied from the outside. The characteristic check is to check whether signals generated from the solid-state imaging device have linearity with respect to an amount of light incident thereon. The operation check and the characteristic check of the first substrate 90 and the second substrate 91 are performed in a state in which light is incident on the photoelectric conversion elements 911.

SUMMARY OF THE INVENTION

According to a first aspect of the present invention, a solid-state imaging device includes: a first substrate; and a second substrate electrically connected to the first substrate by a connecting portion. Circuit elements constituting pixels including first pixels and second pixels are disposed in the first substrate and the second substrate. The first substrate includes a first semiconductor layer, and one or more first wiring layers which are disposed between the first semiconductor layer and the second substrate. The second substrate includes a second semiconductor layer, and one or more second wiring layers which are disposed between the second semiconductor layer and the first substrate. Each of the first pixels includes a first photoelectric conversion element that is formed in the first semiconductor layer and configured to convert light into a first electrical signal. Each of the second pixels includes a second photoelectric conversion element that is formed in the first semiconductor layer and configured to convert light into a second electrical signal. The first photoelectric conversion element overlaps any of the one or more first wiring layers at all positions on the first photoelectric conversion element in a planar view of the first substrate. The second photoelectric conversion element does not overlap any of the one or more first wiring layers at some positions on the second photoelectric conversion element in the planar view of the first substrate. The first substrate further includes a light-blocking film configured to block light incident on the second photoelectric conversion element. The first semiconductor layer is disposed between the light-blocking film and the one or more first wiring layers.

According to a second aspect of the present invention, in the solid-state imaging device according to the first aspect of the present invention, the first substrate may further include a first control unit that performs a control of outputting only a pixel signal based on the second electrical signal to an outside.

According to a third aspect of the present invention, in the solid-state imaging device according to the second aspect of the present invention, the first substrate or the second substrate may further include a second control unit that performs a control of outputting only a pixel signal based on the first electrical signal to the outside.

According to a fourth aspect of the present invention, in the solid-state imaging device according to the first aspect of the present invention, the second pixels may be arranged at an end of a pixel area in which the pixels are arranged.

According to a fifth aspect of the present invention, in the solid-state imaging device according to the first aspect of the present invention, the second pixels may be arranged at a plurality of positions in a pixel area in which the pixels are arranged.

According to a sixth aspect of the present invention, an imaging apparatus includes the solid-state imaging device according to the first aspect of the present invention.

BRIEF DESCRIPTION OF THE DRAWINGS

FIG. 8 is a cross-sectional view illustrating a process of manufacturing a solid-state imaging device.

DETAILED DESCRIPTION OF THE INVENTION

Hereinafter, embodiments of the present invention will be described with reference to the accompanying drawings.

First Embodiment

Figure 1:
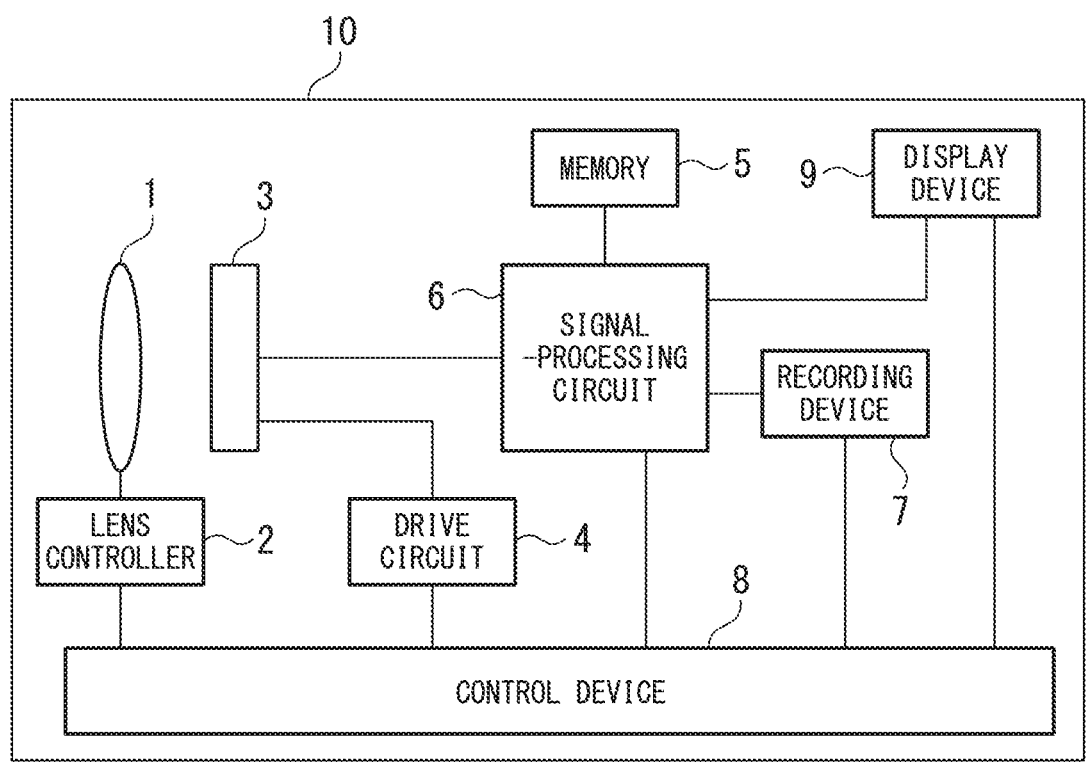
FIG. 1 is a block diagram illustrating a configuration of an imaging apparatus employing a solid-state imaging device according to a first embodiment of the present invention.

First, a first embodiment of the present invention will be described. FIG. 1 illustrates a configuration of a digital camera as an example of an imaging apparatus employing a solid-state imaging device according to this embodiment. The imaging apparatus according to an aspect of the present invention only has to be an electronic apparatus having an imaging function, and examples thereof include a digital video camera and an endoscope in addition to a digital camera. A digital camera 10 illustrated in FIG. 1 includes a lens unit 1, a lens controller 2, a solid-state imaging device 3, a drive circuit 4, a memory 5, a signal-processing circuit 6, a recording device 7, a control device 8, and a display device 9.

The lens unit 1 includes a zoom lens or a focusing lens and focuses light from a subject as a subject image on a light-receiving surface of the solid-state imaging device 3. The lens controller 2 controls zoom, focus, aperture, and the like of the lens unit 1. Light introduced via the lens unit 1 is focused on the light-receiving surface of the solid-state imaging device 3. The solid-state imaging device 3 converts the subject image focused on the light-receiving surface into image signals and outputs the image signals. A plurality of pixels are two-dimensionally arranged in a row direction and a column direction on the light-receiving surface of the solid-state imaging device 3.

The drive circuit 4 drives the solid-state imaging device 3 to control the operation thereof. The memory 5 temporarily stores image data. The signal-processing circuit 6 performs a predetermined process on the image signals output from the solid-state imaging device 3. Examples of the process performed by the signal-processing circuit 6 include amplification of an image signal, a variety of corrections of image data, and compression of image data.

The recording device 7 includes a semiconductor memory which image data is recorded on or read out from, and is built in the digital camera 10 in a detachable state. The display device 9 performs display of a moving image (a live view image), display of a still image, display of a moving image or a still image recorded on the recording device 7, display of a state of the digital camera 10, and the like.

The control device 8 controls the entire digital camera 10. The operation of the control device 8 is defined in a program stored in a ROM built in the digital camera 10. The control device 8 reads the program and performs a variety of controls based on details defined in the program.

Figure 2:
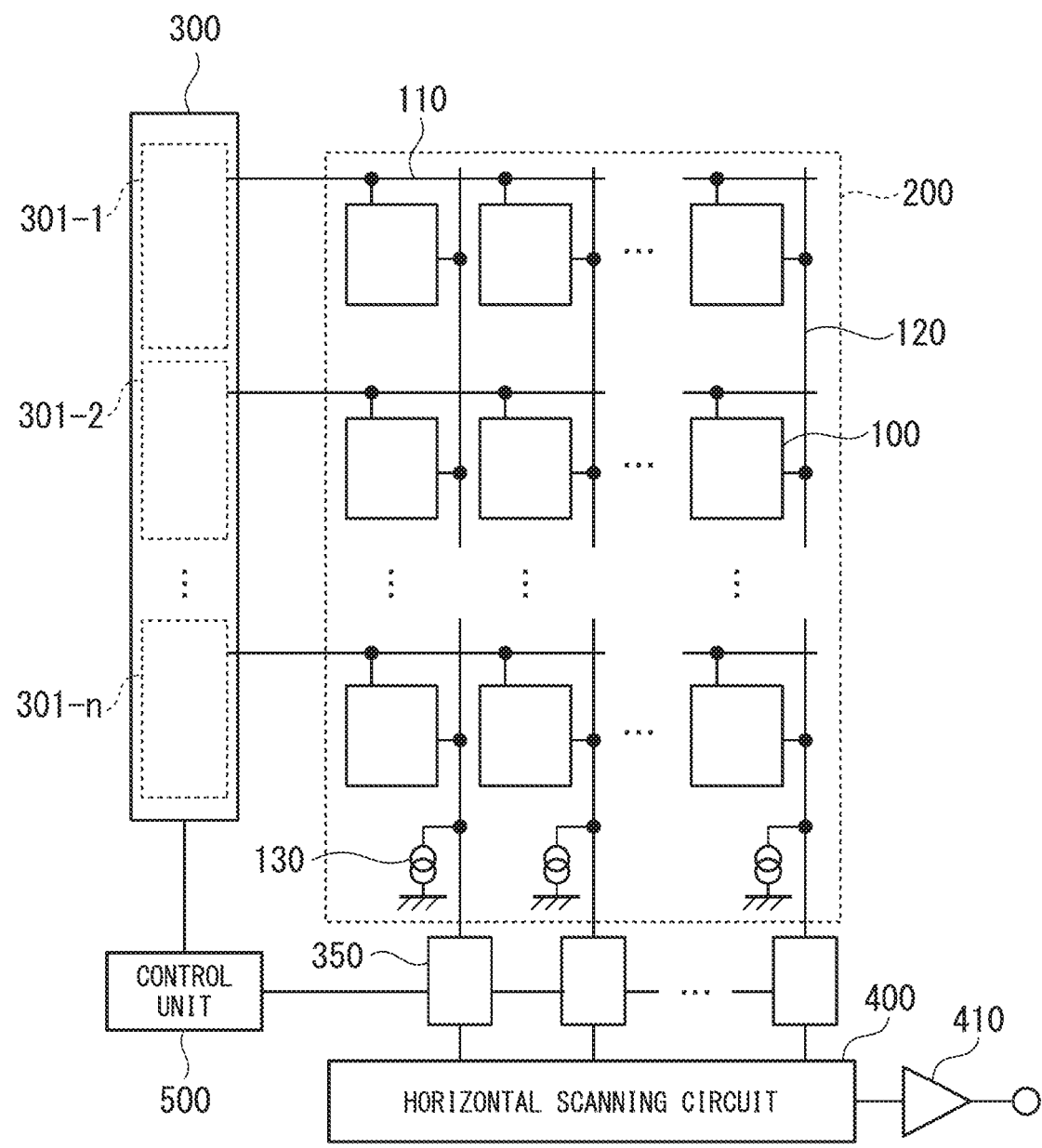
FIG. 2 is a block diagram illustrating a configuration of the solid-state imaging device according to the first embodiment of the present invention.

FIG. 2 illustrates a configuration of the solid-state imaging device 3. The solid-state imaging device 3 illustrated in FIG. 2 includes a pixel unit 200 (a pixel array), a vertical scanning circuit 300, a column-processing circuit 350, a horizontal scanning circuit 400, an output unit 410, and a control unit 500. The positions of the circuit elements illustrated in FIG. 2 are not necessarily matched with actual positions thereof.

The pixel unit 200 includes pixels 100 which are arranged in a two-dimensional matrix shape and a current source 130 which is disposed for each column. In this embodiment, an area including all the pixels of the solid-state imaging device 3 is set as a reading target area for reading pixel signals, but a part of the area including all the pixels of the solid-state imaging device 3 may be set as a reading target area. The reading target area preferably includes at least all the pixels of an effective pixel area. The reading target area may include optical black pixels (normally-shaded pixels) which are arranged outside the effective pixel area. Pixel signals read from the optical black pixels are used, for example, to correct a dark current component.

The vertical scanning circuit 300 performs drive control of the pixel unit 200 for each row. In order to perform this drive control, the vertical scanning circuit 300 includes the same number of unit circuits 301-1, 301-2, . . . , 301-n (where n is the number of rows) as the number of rows.

Each unit circuit 301-i (where i=1, 2, . . . , n) outputs a control signal for controlling pixels 100 of one row to a signal line 110 disposed for each row. The signal line 110 is connected to the pixels 100 and supplies the control signal output from the unit circuit 301-i to the pixels 100. In FIG. 2, the signal line 110 corresponding to each row is illustrated as a single line, but each signal line 110 includes a plurality of signal lines. The signals of the pixels 100 of the row selected by the control signal are output to a vertical signal line 120 disposed for each column.

The current source 130 is connected to the corresponding vertical signal line 120 and forms a source follower circuit along with an amplification transistor in each of the pixels 100. The column-processing circuit 350 performs a signal process such as noise reduction on the pixel signals output to the vertical signal line 120. The horizontal scanning circuit 400 outputs the pixel signals of the pixels 100 for each row which are output to the vertical signal lines 120 and are processed by the column-processing circuit 350 to the output unit 410 in a time-series manner in the order of horizontal arrangement. The output unit 410 amplifies the pixel signals output from the horizontal scanning circuit 400, and outputs the amplified pixel signals to the outside of the solid-state imaging device 3 as image signals. The control unit 500 generates the control signals, and outputs the control signals to the vertical scanning circuit 300 and the horizontal scanning circuit 400 to control the vertical scanning circuit 300 and the horizontal scanning circuit 400.

Figure 3:
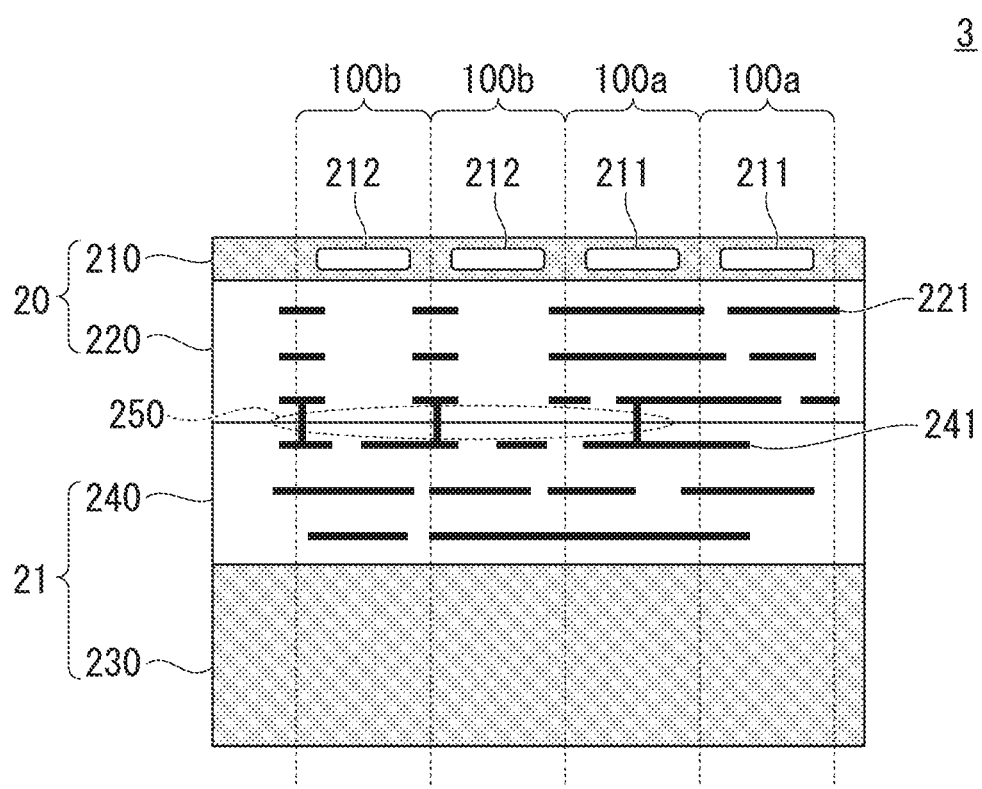
FIG. 3 is a cross-sectional view of the solid-state imaging device according to the first embodiment of the present invention.

FIG. 3 schematically illustrates a cross-sectional structure of the solid-state imaging device 3. The solid-state imaging device 3 includes two substrates (a first substrate 20 and a second substrate 21) in which circuit elements (such as photoelectric conversion elements, transistors, and capacitors) of the pixels 100 are arranged, and has a structure in which the two substrates are superimposed on each other. The circuit elements of the pixels 100 are distributed to and arranged on the first substrate 20 and the second substrate 21. The first substrate 20 and the second substrate 21 are electrically connected to each other so as to transmit and receive electrical signals between the two substrates when the pixels 100 are driven.

The vertical scanning circuit 300, the column-processing circuit 350, the horizontal scanning circuit 400, the output unit 410, and the control unit 500, other than the pixels 100, may be disposed in any of the first substrate 20 and the second substrate 21. The circuit elements of the vertical scanning circuit 300, the column-processing circuit 350, the horizontal scanning circuit 400, the output unit 410, and the control unit 500 may be distributed to and arranged on the first substrate 20 and the second substrate 21.

The first substrate 20 includes a first semiconductor layer 210 in which first photoelectric conversion elements 211 and second photoelectric conversion elements 212 are formed, and a first interlayer film 220 in which one or more first wiring layers 221 disposed between the first semiconductor layer 210 and the second substrate 21 are formed. The second substrate 21 includes a second semiconductor layer 230 in which memory elements (not illustrated) storing the electric signals generated by the first photoelectric conversion elements 211 and the second photoelectric conversion elements 212 are formed, and a second interlayer film 240 in which one or more second wiring layers 241 disposed between the second semiconductor layer 230 and the first substrate 20 are formed.

The first substrate 20 and the second substrate 21 are bonded to each other in a state in which the first interlayer film 220 and the second interlayer film 240 face each other. In the state in which the first substrate 20 and the second substrate 21 are bonded to each other, the first wiring layer 221 and the second wiring layer 241 are connected to each other by a connecting portion 250. The connecting portion 250 are formed of a material having a conductance higher than that of a semiconductor material of the first semiconductor layer 210, for example, a metal material such as aluminum (Al) or copper (Cu).

The first semiconductor layer 210 is formed of a semiconductor material such as silicon (Si). Since the first semiconductor layer 210 is ground in manufacturing the solid-state imaging device 3, the first semiconductor layer 210 is thinner than the second semiconductor layer 230. The thickness of the first semiconductor layer 210 is, for example, 3 μm. In the first semiconductor layer 210, an opposite surface (a surface exposed to the outside) of a surface in contact with the first interlayer film 220 is a rear surface of the first semiconductor layer 210.

The first photoelectric conversion elements 211 are formed in the first semiconductor layer 210 so as to convert light into a first electrical signal. The second photoelectric conversion elements 212 are formed in the first semiconductor layer 210 so as to convert light into a second electrical signal. The first photoelectric conversion elements 211 and the second photoelectric conversion elements 212 are formed of a semiconductor material having an impurity concentration different from that of the semiconductor material of the first semiconductor layer 210. In this embodiment, each pixel 100 includes a first pixel 100a having the first photoelectric conversion element 211 formed therein, and a second pixel 100b having the second photoelectric conversion element 212 formed therein. The first pixel 100a and the second pixel 100b are different from each other in the pattern of the first wiring layer 221. How the first pixels 100a and the second pixels 100b are arranged in the pixel unit 200 is not particularly limited in this embodiment.

The first interlayer film 220 is formed on a surface of the first semiconductor layer 210 and is disposed between the first semiconductor layer 210 and the second substrate 21. The first interlayer film 220 is formed of an insulating material such as silicon dioxide ($SiO_2$). The thickness of the first interlayer film 220 is, for example, 10 µm.

The first wiring layer 221 is formed in the first interlayer film 220 so as to transmit signals such as the electrical signals generated by the first photoelectric conversion elements 211 and the second photoelectric conversion elements 212. The first wiring layer 221 is formed of a material having a light reflectance higher (a light transmittance lower) than that of the semiconductor material of the first semiconductor layer 210 and conductance higher than that of the semiconductor material, for example, a metal material such as aluminum (Al) or copper (Cu). In the example illustrated in FIG. 3, three first wiring layers 221 are formed.

In the first interlayer film 220, the three first wiring layers 221 are separated from each other in a direction perpendicular to a main surface (a surface having a surface area larger than that of the side surfaces) of the first substrate 20. The first wiring layers 221 are connected to the connecting portion 250, and a signal transmitted by the first wiring layers 221 is transmitted to the second substrate 21 via the connecting portion 250. A signal transmitted by the second substrate 21 may be transmitted to the first wiring layers 221 via the connecting portion 250. Since the first substrate 20 and the second substrate 21 are bonded to each other in a state in which the first interlayer film 220 and the second interlayer film 240 face each other, the first wiring layers 221 are disposed in the first substrate 20 between the first semiconductor layer 210 and the second substrate 21.

The second semiconductor layer 230 is formed of a semiconductor material such as silicon (Si). The thickness of the second semiconductor layer 230 is, for example, 300 to 500 µm. In the second semiconductor layer 230, an opposite surface (a surface exposed to the outside) of a surface in contact with the second interlayer film 240 is a rear surface of the second semiconductor layer 230.

The second interlayer film 240 is formed on a surface of the second semiconductor layer 230 and is disposed between the second semiconductor layer 230 and the first substrate 20. The second interlayer film 240 is formed of an insulating material such as silicon dioxide ($SiO_2$). The thickness of the second interlayer film 240 is, for example, 10 µm.

The second wiring layer 241 is formed in the second interlayer film 240 so as to transmit signals such as the electrical signals generated by the first photoelectric conversion elements 211 and the second photoelectric conversion elements 212. The second wiring layer 241 is formed of a material having a light reflectance higher (a light transmittance lower) than that of a semiconductor material of the second semiconductor layer 230 and conductance higher than that of the semiconductor material, for example, a metal material such as aluminum (Al) or copper (Cu). In the example illustrated in FIG. 3, three second wiring layers 241 are formed.

In the second interlayer film 240, the three second wiring layers 241 are separated from each other in a direction perpendicular to a main surface of the second substrate 21. The second wiring layers 241 are connected to the connecting portion 250, and a signal input from the first substrate 20 via the connecting portion 250 is transmitted in the second substrate 21. A signal transmitted by the second substrate 21 may be transmitted to the first substrate 20 via the connecting portion 250.

The above-mentioned materials or thicknesses are merely examples. Accordingly, the materials or thicknesses of the semiconductor layers or the interlayer films of the first substrate 20 and the second substrate 21 may be appropriately determined. In the example of this embodiment, three first wiring layers 221 and three second wiring layers 241 are formed, but the number of layers of the first wiring layers 221 and the second wiring layers 241 are arbitrary, and the number of layers of the first wiring layers 221 and the number of layers of the second wiring layers 241 may not be equal to each other.

Before the first substrate 20 and the second substrate 21 are bonded to each other, an operation check and a characteristic check are performed on the individual substrates. The first wiring layer 221 is patterned such that, for example, openings are formed at the positions at which the second photoelectric conversion elements 212 are formed. Accordingly, when the operation check and the characteristic check of the first substrate 20 are performed, a part of light incident from a front surface side of the first semiconductor layer 210 (the first interlayer film 220) is not reflected by the first wiring layer 221 and is incident on the second photoelectric conversion elements 212. Accordingly, it is possible to increase an amount of light reaching the photoelectric conversion elements in performing the operation check and the characteristic check on the first substrate 20.

On the other hand, when the solid-state imaging device 3 operates in the state in which the first substrate 20 and the second substrate 21 are bonded to each other, light which is incident on the first pixel 100a including the first photoelectric conversion element 211 and is transmitted by the first semiconductor layer 210 out of light incident on the rear surface of the first semiconductor layer 210 is reflected by the first wiring layer 221. Accordingly, light transmitted by the first semiconductor layer 210 is not incident on the memory element formed in the second semiconductor layer 230. As a result, when the solid-state imaging device 3 operates, it is possible to reduce noise generated due to incidence of light on the memory element and to maintain quality of image signals.

Figure 4:
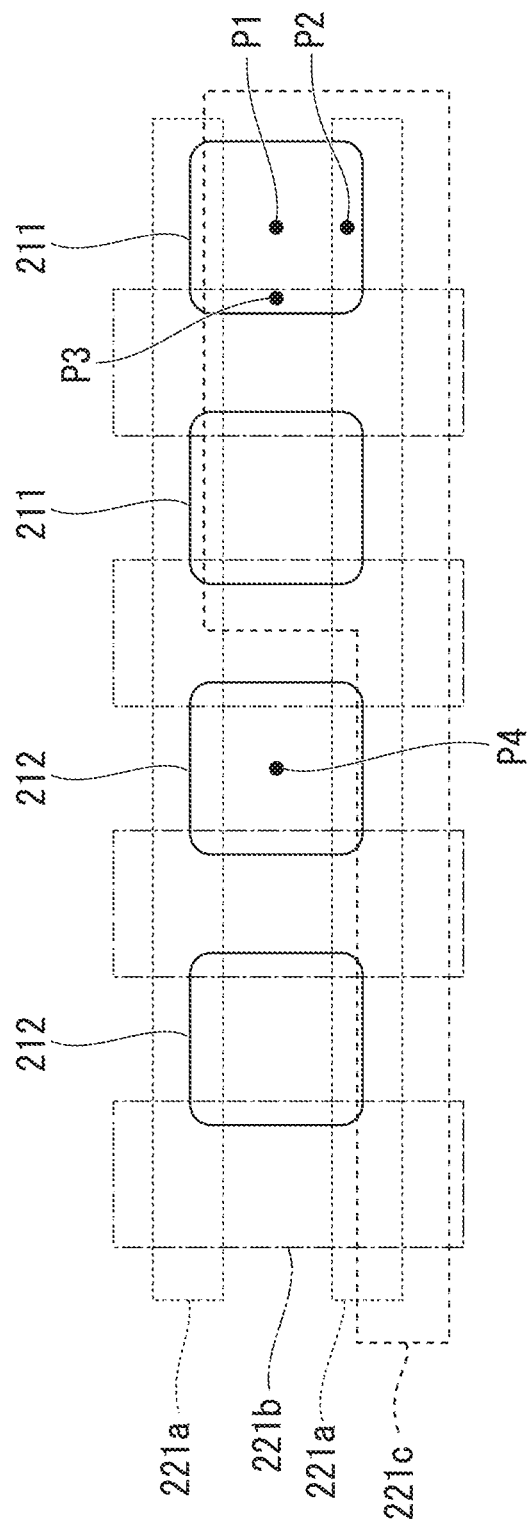
FIG. 4 is a plan view illustrating a positional relationship between photoelectric conversion elements and wiring layers included in the solid-state imaging device according to the first embodiment of the present invention.

FIG. 4 illustrates a positional relationship between the first wiring layers 221, and the first photoelectric conversion elements 211 and the second photoelectric conversion elements 212. In FIG. 4, a state when the first substrate 20 is two-dimensionally viewed in the direction perpendicular to the main surface of the first substrate 20 is illustrated. The first wiring layer 221 includes three first wiring layers 221a, 221b, and 221c.

When the first substrate 20 is two-dimensionally viewed, the first photoelectric conversion element 211 overlaps any of the first wiring layers 221a, 221b, and 221c at all positions on the first photoelectric conversion element 211. For example, at the position of a point P1 on the first photoelectric conversion element 211, the first photoelectric conversion element 211 does not overlap the first wiring layers 221a and 221b, but the first photoelectric conversion element 211 overlaps the first wiring layer 221c. At the position of a point P2 on the first photoelectric conversion element 211, the first photoelectric conversion element 211 does not overlap the first wiring layer 221b, but the first photoelectric conversion element 211 overlaps the first wiring layers 221a and 221c. At the position of a point P3 on the first photoelectric conversion element 211, the first photoelectric conversion element 211 does not overlap the first wiring layer 221a, but the first photoelectric conversion element 211 overlaps the first wiring layers 221b and 221c. Accordingly, light incident on the first photoelectric conversion element 211 from the rear surface of the first semiconductor layer 210 and transmitted by the first photoelectric conversion element 211 is reflected by any of the first wiring layers 221a, 221b, and 221c. Accordingly, the memory elements disposed in the second semiconductor layer 230 can be shaded.

When the first substrate 20 is two-dimensionally viewed, the second photoelectric conversion element 212 does not overlap any of the first wiring layers 221a, 221b, and 221c at some positions on the second photoelectric conversion element 212. For example, at the position of a point P4 on the second photoelectric conversion element 212, the second photoelectric conversion element 212 does not overlap the first wiring layers 221a, 221b, and 221c. Accordingly, a part of light incident from the front surface side of the first semiconductor layer 210 (the first interlayer film 220) is not reflected by any of the first wiring layers 221a, 221b, and 221c, and is incident on the second photoelectric conversion element 212. Accordingly, it is possible to perform the operation check and the characteristic check on the first substrate 20 based on the pixel signals based on the electrical signals generated from the second photoelectric conversion elements 212.

When the first substrate 20 is two-dimensionally viewed, the second photoelectric conversion elements 212 may not overlap any of the first wiring layers 221a, 221b, and 221c at all positions on the second photoelectric conversion element 212, and the second photoelectric conversion element 212 may overlap any of the first wiring layers 221a, 221b, and 221c at positions in some areas on the second photoelectric conversion element 212. When the first substrate 20 is two-dimensionally viewed, the area of an area including points not overlapping any of the first wiring layers 221a, 221b, and 221c on the second photoelectric conversion elements 212 is preferably, for example, 50% or more of the entire area of the second photoelectric conversion element 212.

When the operation check and the characteristic check of the first substrate 20 are performed, only the pixel signal based on the electrical signal generated from the second photoelectric conversion element 212 is read. For example, when the control unit 500 is disposed in the first substrate 20 and the operation check and the characteristic check of the first substrate 20 are performed, the control unit 500 (a first control unit) performs a control of reading only the pixel signal based on the electrical signal generated from the second photoelectric conversion element 212. When the control unit 500 includes a first control circuit disposed in the first substrate 20 and a second control circuit disposed in the second substrate 21, the first control circuit (a first control unit) performs the control.

Both the vertical scanning circuit 300 and the horizontal scanning circuit 400 may be disposed in the first substrate 20, or both circuits may be distributed and disposed in the first substrate and the second substrate. In any case, when the operation check and the characteristic check of the first substrate 20 are performed, the circuit disposed in the first substrate 20 reads the pixel signal in response to the control signal from the control unit 500.

When imaging is performed after the first substrate 20 and the second substrate 21 are bonded to each other, only the pixel signal based on the electrical signal generated from the first photoelectric conversion element 211 is read. At this time, the control unit 500 (a second control unit) controls the vertical scanning circuit 300 and the horizontal scanning circuit 400 so as to read only the pixel signal based on the electrical signal generated from the first photoelectric conversion element 211.

When the solid-state imaging device 3 operates, a part of light which is incident on the rear surface of the first semiconductor layer 210 and is transmitted by the first semiconductor layer 210 may be reflected by the first wiring layer 221 and be incident on the first photoelectric conversion element 211 and the second photoelectric conversion element 212. A pattern of the first wiring layer 221 differs between a position at which the first photoelectric conversion element 211 is disposed and a position at which the second photoelectric conversion element 212 is disposed, as described above. Accordingly, even when uniform light is incident, the electrical signals generated from the first photoelectric conversion element 211 and the second photoelectric conversion element 212 may be different from each other due to a difference between an amount of light which is reflected by the first wiring layer 221 and is incident on the first photoelectric conversion element 211 and an amount of light which is reflected by the first wiring layer 221 and is incident on the second photoelectric conversion element 212. In consideration of this, only the pixel signal based on the electrical signal generated from the first photoelectric conversion element 211 is read in performing imaging in this embodiment. Since no pixel signal is read from the second pixel 100b, for example, the pixel signal of the second pixel 100b may be interpolated using the pixel signal read from the first pixel 100a.

As described above, according to this embodiment, since the second photoelectric conversion element 212 does not overlap any of one or more first wiring layers 221 at some positions on the second photoelectric conversion element 212, it is possible to increase an amount of light reaching the photoelectric conversion element when at least one of the operation check and the characteristic check of the first substrate 20 are performed.

Second Embodiment

Figure 5:
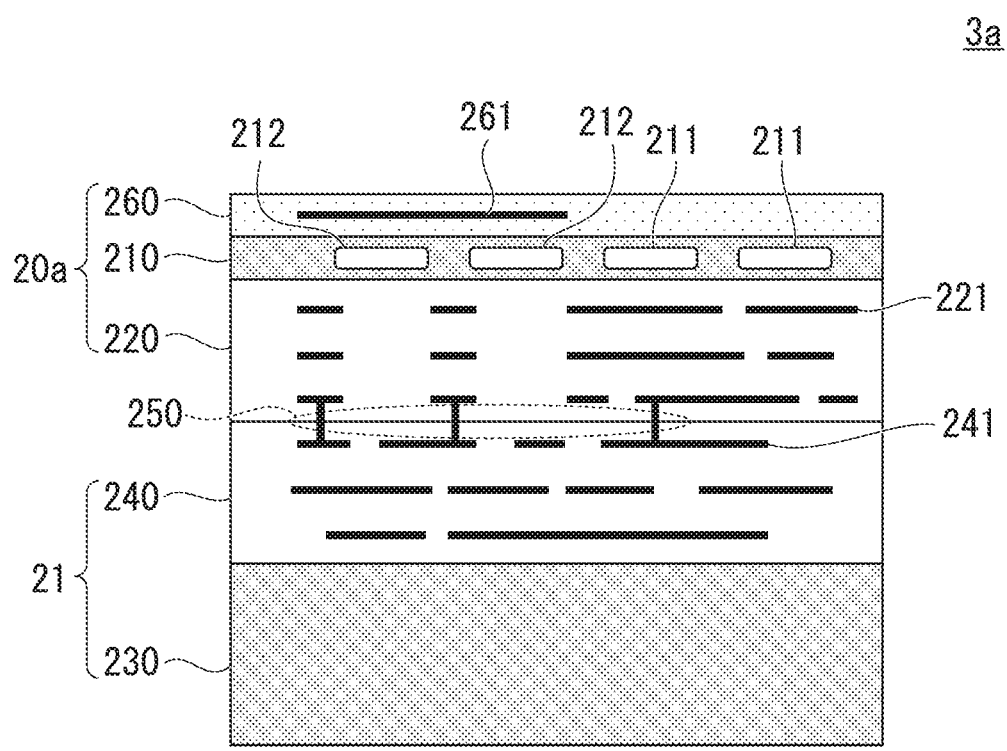
FIG. 5 is a cross-sectional view of a solid-state imaging device according to a second embodiment of the present invention.

A second embodiment of the present invention will be described below. FIG. 5 schematically illustrates a cross-sectional structure of a solid-state imaging device 3a according to this embodiment. In FIG. 5, the same elements as illustrated in FIG. 3 are referenced by the same reference numerals or signs. The solid-state imaging device 3a according to this embodiment has a structure in which a first substrate 20a and a second substrate 21 are superimposed on each other. The second substrate 21 is the same as the second substrate 21 in the first embodiment.

The first substrate 20a includes a first semiconductor layer 210, a first interlayer film 220, and an insulating film 260 having a light-blocking film 261 formed therein. The first substrate 20a is different from the first substrate 20 in the first embodiment in that the insulating film 260 is formed on the rear surface of the first semiconductor layer 210.

The insulating film 260 is formed of an insulating material such as silicon dioxide ($SiO_2$). The light-blocking film 261 blocking light incident on the second photoelectric conversion element 212 is formed in the insulating film 260. The first semiconductor layer 210 is disposed between the light-blocking film 261, and the first interlayer film 220 and the first wiring layer 221. In the insulating film 260, the light-blocking film 261 is formed at a position corresponding to the second photoelectric conversion element 212. The light-blocking film 261 is formed of a material having a light reflectance higher (a light transmittance lower) than that of the semiconductor material of the first semiconductor layer 210, for example, a metal material such as tungsten (W). In this embodiment, the second pixel 100b having the second photoelectric conversion element 212 is used as a shaded optical black pixel.

FIGS. 6A to 6D illustrate a pixel area Sp which is occupied by a pixel unit 200 having pixels 100 arranged therein. In FIGS. 6A to 6D, a state when the pixel area Sp is two-dimensionally viewed in a direction perpendicular to a main surface of the first substrate 20a is illustrated. The pixel area Sp includes a first pixel area Sp1 including first pixels 100a and a second pixel area Sp2 including second pixels 100b. In any of FIGS. 6A to 6D, the second pixel area Sp2 is disposed at an end of the pixel area Sp. That is, the second pixels 100b are disposed at the end of the pixel area Sp.

Figure 6A:
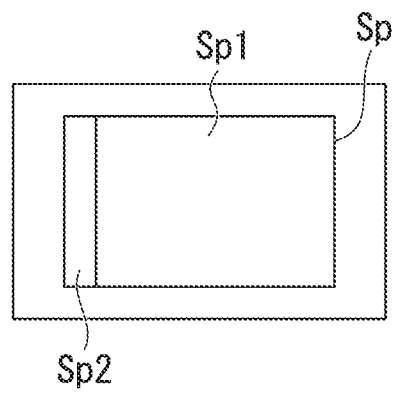
FIG. 6A is a plan view illustrating a pixel area in the second embodiment of the present invention.
Figure 6B:
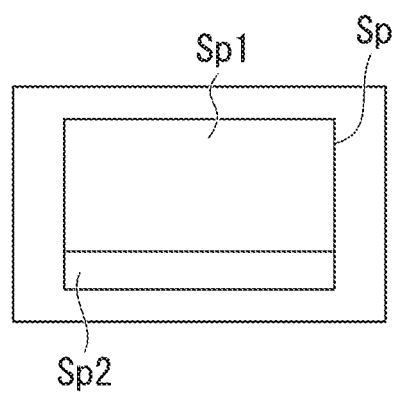
FIG. 6B is a plan view illustrating a pixel area in the second embodiment of the present invention.

More specifically, in FIG. 6A, the second pixel area Sp2 is disposed at a left end of the pixel area Sp. The second pixel area Sp2 may be disposed at a right end of the pixel area Sp. In FIG. 6B, the second pixel area Sp2 is disposed at a lower end of the pixel area Sp. The second pixel area Sp2 may be disposed at an upper end of the pixel area Sp.

Figure 6C:
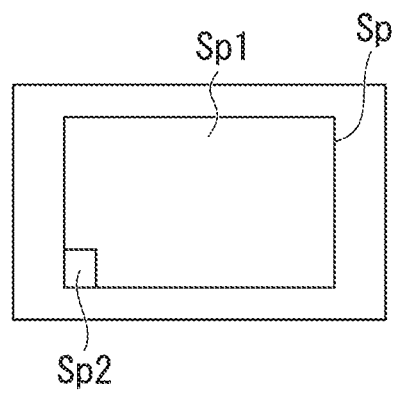
FIG. 6C is a plan view illustrating a pixel area in the second embodiment of the present invention.
Figure 6D:
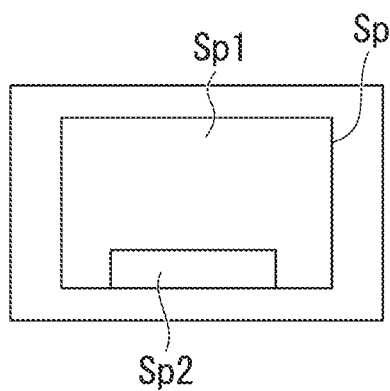
FIG. 6D is a plan view illustrating a pixel area in the second embodiment of the present invention.

In FIG. 6C, the second pixel area Sp2 is disposed at a lower-left corner of the pixel area Sp. The second pixel area Sp2 may be disposed at an upper-left corner, an upper-right corner, or a lower-right corner of the pixel area Sp. In FIG. 6D, the second pixel area Sp2 is disposed in a part of the lower end of the pixel area Sp other than the lower-left corner and the lower-right corner. The second pixel area Sp2 may be disposed in a part of the upper end of the pixel area Sp other than the upper-left corner and the upper-right corner. The second pixel area Sp2 may be disposed in a part of the left end of the pixel area Sp other than the upper-left corner and the lower-left corner. The second pixel area Sp2 may be disposed in a part of the right end of the pixel area Sp other than the upper-right corner and the lower-right corner.

When the operation check and the characteristic check of the first substrate 20a are performed, only a pixel signal based on an electrical signal generated from the second photoelectric conversion element 212 is read as in the first embodiment. The control of this reading is performed by the control unit 500. When the control unit 500 is disposed in the first substrate 20a, the control unit 500 (a first control unit) performs this control. When the control unit 500 includes a first control circuit disposed in the first substrate 20a and a second control circuit disposed in the second substrate 21, the first control circuit (a first control unit) performs the control.

Both the vertical scanning circuit 300 and the horizontal scanning circuit 400 may be disposed in the first substrate 20a, or both circuits may be distributed and disposed in the first substrate and the second substrate. In any case, when the operation check and the characteristic check of the first substrate 20a are performed, the circuit disposed in the first substrate 20a reads the pixel signal in response to the control signal from the control unit 500.

When imaging is performed after the first substrate 20a and the second substrate 21 are bonded to each other, only the pixel signal based on the electrical signal generated from the first photoelectric conversion element 211 is read. At this time, the control unit 500 (a second control unit) controls the vertical scanning circuit 300 and the horizontal scanning circuit 400 so as to read only the pixel signal based on the electrical signal generated from the first photoelectric conversion element 211. When a correction pixel signal is acquired from the optical black pixels immediately before or after the imaging is performed, only the pixel signal based on the electrical signal generated from the second photoelectric conversion element 212 is read. At this time, the control unit 500 controls the vertical scanning circuit 300 and the horizontal scanning circuit 400 so as to read only the pixel signal based on the electrical signal generated from the second photoelectric conversion element 212.

Accordingly, when the solid-state imaging device 3a operates after the first substrate 20a and the second substrate 21 are bonded to each other, the control unit 500 performs a control of switching two types of modes. One of the two types of modes is a mode in which only the pixel signal based on the electrical signal generated from the first photoelectric conversion element 211 is output to the outside. The other of the two types of modes is a mode in which only the pixel signal based on the electrical signal generated from the second photoelectric conversion element 212 is output to the outside.

As described above, according to this embodiment, the second pixels 100b can be used as optical black pixels. As the control unit 500 performs the control of switching a mode between a first mode and a second mode, it is possible to read only the pixel signal based on the electrical signal generated from the first photoelectric conversion element 211 and the pixel signal based on the electrical signal generated from the second photoelectric conversion element 212 independently from each other.

Third Embodiment

A third embodiment of the present invention will be described below. The configuration of a solid-state imaging device according to this embodiment is the same as the configuration of the solid-state imaging device 3 according to the first embodiment.

Figure 7:
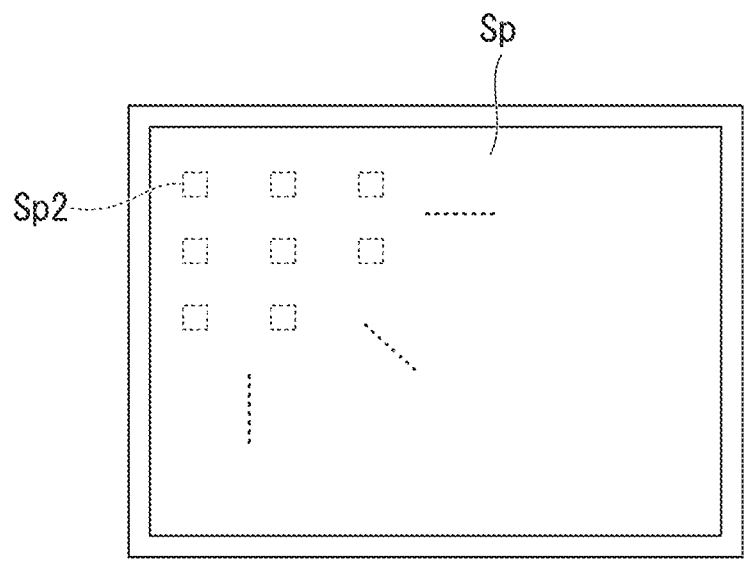
FIG. 7 is a plan view illustrating a pixel area in a third embodiment of the present invention.

FIG. 7 illustrates a pixel area Sp which is occupied by the pixel unit 200 having the pixels 100 arranged therein. In FIG. 7, a state when the pixel area Sp is two-dimensionally viewed in the direction perpendicular to the main surface of the first substrate 20 is illustrated. The pixel area Sp includes a plurality of second pixel areas Sp2 including the second pixels 100b. The plurality of second pixel areas Sp2 are dispersively disposed in the pixel area Sp. That is, the second pixels 100b are arranged at a plurality of positions in the pixel area Sp. In the pixel area Sp, an area other than the second pixel areas Sp2 is an area including the first pixels 100a.

When the operation check and the characteristic check of the first substrate 20 are performed, only a pixel signal based on an electrical signal generated from the second photoelectric conversion element 212 is read as in the first embodiment. The control of this reading is performed by the control unit 500. When the control unit 500 is disposed in the first substrate 20, the control unit 500 (a first control unit) performs this control. When the control unit 500 includes a first control circuit disposed in the first substrate 20 and a second control circuit disposed in the second substrate 21, the first control circuit (a first control unit) performs the control.

Both the vertical scanning circuit 300 and the horizontal scanning circuit 400 may be disposed in the first substrate 20, or both circuits may be distributed and disposed in the first substrate and the second substrate. In any case, when the operation check and the characteristic check of the first substrate 20 are performed, the circuit disposed in the first substrate 20 reads the pixel signal in response to the control signal from the control unit 500.

When imaging is performed after the first substrate 20 and the second substrate 21 are bonded to each other, only the pixel signal based on the electrical signal generated from the first photoelectric conversion element 211 is read. At this time, the control unit 500 (a second control unit) controls the vertical scanning circuit 300 and the horizontal scanning circuit 400 so as to read only the pixel signal based on the electrical signal generated from the first photoelectric conversion element 211. Since no pixel signal is read from the second pixel 100b, for example, the pixel signal of the second pixel 100b may be interpolated using the pixel signal read from the first pixel 100a.

As described above, according to this embodiment, when the operation check and the characteristic check of the first substrate 20 are performed, the pixel signals based on the electrical signals generated from the second photoelectric conversion elements 212 of the second pixels 100b which are distributed and disposed in the entire pixel area are read. Accordingly, it is possible to perform the operation check and the characteristic check over the entire pixel area.

While exemplary embodiments of the present invention have been described above, the present invention is not limited to the embodiments. An element can be added, omitted, substituted, and modified without departing from the spirit and scope of the present invention. The present invention is not limited by the above-mentioned description, and is only limited by the appended claims.

What is claimed is:

1. A solid-state imaging device comprising:
a first substrate; and
a second substrate electrically connected to the first substrate by a connecting portion, wherein
circuit elements constituting pixels including first pixels and second pixels are disposed in the first substrate and the second substrate,
the first substrate includes a first semiconductor layer, and one or more first wiring layers which are disposed between the first semiconductor layer and the second substrate,
the second substrate includes a second semiconductor layer, and one or more second wiring layers which are disposed between the second semiconductor layer and the first substrate,
each of the first pixels includes a first photoelectric conversion element that is formed in the first semiconductor layer and configured to convert light into a first electrical signal,
each of the second pixels includes a second photoelectric conversion element that is formed in the first semiconductor layer and configured to convert light into a second electrical signal,
the first photoelectric conversion element overlaps any of the one or more first wiring layers at all positions on the first photoelectric conversion element in a planar view of the first substrate,
the second photoelectric conversion element does not overlap any of the one or more first wiring layers at some positions on the second photoelectric conversion element in the planar view of the first substrate,
the first substrate further includes a light-blocking film configured to block light incident on the second photoelectric conversion element from a surface of the first substrate of an opposite to the connecting portion,
the first semiconductor layer is disposed between the light-blocking film and the one or more first wiring layers,
the second photoelectric conversion element and the first wiring layer are disposed to be adapted to an arrangement of memory elements on the second substrate.

2. The solid-state imaging device according to claim 1, wherein the first substrate further includes a first control unit that performs a control of outputting only a pixel signal based on the second electrical signal to an outside.

3. The solid-state imaging device according to claim 2, wherein the first substrate or the second substrate further includes a second control unit that performs a control of outputting only a pixel signal based on the first electrical signal to the outside.

4. The solid-state imaging device according to claim 1, wherein the second pixels are arranged at an end of a pixel area in which the pixels are arranged.

5. The solid-state imaging device according to claim 1, wherein the second pixels are arranged at a plurality of positions in a pixel area in which the pixels are arranged.

6. An imaging apparatus comprising the solid-state imaging device according to claim 1.

* * * * *